United States Patent [19]

Shinoda et al.

[11] Patent Number: 5,543,256
[45] Date of Patent: Aug. 6, 1996

[54] METHOD FOR EXPOSING A PATTERN PLATE HAVING AN ALIGNMENT PATTERN AND A PATTERN PLATE EXPOSED BY SAID METHOD

[75] Inventors: Toshiki Shinoda; Tetsuo Takezawa; Shigeru Noguchi, all of Tokyo, Japan

[73] Assignee: Dai Nippon Printing Co., Ltd., Tokyo, Japan

[21] Appl. No.: 915,939

[22] Filed: Jul. 17, 1992

[30] Foreign Application Priority Data

Jul. 18, 1991 [JP] Japan ................... 3-177871

[51] Int. Cl.$^6$ ........................ G03F 9/00
[52] U.S. Cl. ............... 430/22; 430/5; 356/401; 437/924
[58] Field of Search ............ 430/22, 5; 437/924; 356/401

[56] References Cited

U.S. PATENT DOCUMENTS 4,610,940  9/1986  Araihara ............... 430/22
4,849,313  7/1989  Chapman et al. ............ 430/5
4,974,736  12/1990 Okunuki ............... 219/121.12

*Primary Examiner*—Mark Chapman
*Attorney, Agent, or Firm*—Dellett and Walters

[57] ABSTRACT

The present invention relates to a method for exposing a pattern plate having an alignment pattern, controlling the positional relationship between the alignment pattern and the device pattern with high accuracy. When exposing a device pattern B such as reticle pattern, shadow mask pattern, etc. and alignment patterns A1, A2 and A3, the alignment patterns A1, A2 and A3 are exposed at least once before exposing the device pattern B, and the alignment patterns A1, A2 and A3 are overlap-exposed again after the device pattern has been exposed. Thus, it is possible to almost perfectly correct relative positional deviation between the alignment patterns, which change depending upon the exposure time during exposure of the device pattern, and the device pattern, and to reduce the degradation of the positional accuracy of exposure, which changes according to pattern size.

8 Claims, 6 Drawing Sheets

Exposing order: A1, A2, A3→B→A1, A2, A3

METHOD FOR EXPOSING A PATTERN PLATE HAVING AN ALIGNMENT PATTERN AND A PATTERN PLATE EXPOSED BY SAID METHOD

BACKGROUND OF THE INVENTION

The present invention relates to a method for producing a pattern plate having an alignment pattern (mark) for position alignment, and in particular to a method for producing a large size pattern plate used for a reticle mask, shadow mask, etc. and for producing patterns by projecting on wafer and master mask substrate, and also to a pattern plate exposed by said method.

In recent years, ICs and LSIs have become more and more highly integrated. For example, DRAMs of 4M bits are already manufactured by mass producing, with a trend shifting now toward 16M bits and 64M bits. As the result, there are strong demands to further miniaturize wafer circuit elements. Such miniaturization is also needed in the preparation of associated patterns for the lithographic processes in order to provide the circuit elements on the wafer.

In general, three methods are known for patterning a wafer: The first method employs an EB (electron beam) system or FIB (focusing ion beam) system, and patterns are formed directly on the wafer by controlling an electron beam or ion beam. In this case the exposing position is controlled to match the pattern on the wafer, and patterning accuracy depends only on position detecting ability and exposure position control ability. However, there remain a few limitations in the ability to determine a position on a wafer and the ability to control the exposure position. Because patterns are formed one-by-one in this method it is apparent that this direct write process is time-consuming and accordingly not very suitable for mass production.

In the second method, a mask having a plurality of mask patterns is used wherein each mask pattern of the plurality is of the same size as the pattern of an associated chip to be formed on the wafer, which pattern is accordingly photolithographically transferred to a wafer substrate. This second method is suitable for mass production in that an entire exposure is performed at once for the plurality of chips. Since the plurality of patterns is transferred to the wafer 1:1, the position accuracy of the resulting pattern on the wafer is determined in accordance with the accuracy of pattern alignment. Distortion of the master mask also provides a direct influence on the accuracy.

The third method uses a mask called a reticle mask which has a pattern that is 5–10 times larger than the size of the desired circuit pattern to be produced on a wafer or a master mask. The reticle mask is exposed by reduced projection onto an appropriate wafer substrate. Because this method is based on reduced projection, positioning (overlapping) accuracy error between the pattern on a wafer and the pattern on the reticle mask is also reduced, and higher accuracy is provided. Also, this method is more advantageous than the methods by EB or FIB in production because the entire exposure is performed at once.

As described above, the progress in the technique of IC and LSI circuits toward higher integration, further necessitates higher miniaturization of wafer circuit patterns. As the result, there is a strong demand for improved alignment accuracy (positioning accuracy) between an existing pattern on a wafer and a pattern to be prepared.

Under such circumstances, in the reduced projection exposure method, which was the third pattern preparation procedure described hereinbefore as having good overlapping accuracy with a wafer pattern, there are demands that the overlapping accuracy exceed current levels (i.e. 0.04–0.02 μm). In case of 16M bit DRAM fabrication, it is essential to have overlapping accuracy of 0.02–0.01 μm. In this method, 10 or more reticle masks are normally needed to prepare an LSI, and it is required to have overlapping accuracy of less than 0.02–0.01 μm between the patterns of the various reduced projections.

In the field of color television and displays, the products with associated shadow masks and liquid crystal panels are becoming increasingly larger in recent years. For pattern plates employed in the production of shadow masks and liquid crystal panels, there are demands not only of larger size products, but also of greater resolution (finer size). When an optical exposure system is used, wherein a series of aperture exposures provide a desired exposure pattern in combination for such shadow masks or liquid crystal panels, the number of aperture exposures required increases and the entire exposure time becomes longer accordingly, often lasting for 24 hours. Further, when an electron beam exposure system is used, a long time is required because of the number of raster scans and blankings required of a raster scanning type system for exposing a pattern of a given area; the larger the area of a pattern to be exposed, the more scan lines that are required to perform the exposure. When a vector type system is used for vector scanning of a variable shaped beam, beam scanning is performed in accordance to an aperture as in the case of the optical exposure system, and the time for exposure becomes relatively long.

When the reticle pattern is prepared by an electron beam exposure system, a raster scanning type system is normally used. With a mask substrate fixed on a stage, the stage is moved under control of a position system based on laser interferometry, and the substrate is exposed to irradiation of an electron beam, and the desired picture pattern is depicted by the exposure. The electron beam is irradiated under deflection control and is blanked and unblanked for each predetermined address on the substrate. However, to prepare a finer pattern with high precision, it is necessary to decrease the address step size, which is a unit for exposure, and the time for exposure is extensively increased.

In a vector type electron beam exposure system, desired aperture images are irradiated by the beam, and a pattern is prepared by combining such images. To prepare a finer pattern with high precision, it is necessary to decrease aperture diameter. This also means that the time required for exposure increases extensively.

As described above, when a longer time is required for exposure of a finer pattern, the following problems become important issues in a system with precision control such as an electron beam exposure system: (1) temperature changes of the substrate to be exposed; (2) electrical change; (3) mechanical change; and (4) fluctuation in the position control system. In particular, in the case of a pattern plate, such as a reticle mask, having an alignment pattern, it is necessary that positional relationship between an alignment pattern and a device pattern is precisely arranged in order to control via the alignment pattern the placement of the device pattern onto the wafer based on an accurate positional relationship between the alignment pattern and the device pattern. Such a relationship is also influenced by the above factors (1)–(4). Similarly, the pattern plates for a shadow mask and a liquid crystal panel are also influenced by the above factors (1)–(4).

In most cases, the changes and fluctuations in the above factors (1)–(4) are mono-directional. Factor (1) is considered as caused by the difference between the temperature of the substrate itself and the environmental temperature of the stage to be used. Factor (2) is caused by electrical drift, while factor (3) results mainly from gradual deviation of a cassette, which fixes the substrate to be exposed during X and Y transitions of the stage. Factor (4) is caused by changes in environmental barometric pressure and temperature affecting the interferometer. In general, most of factor (1) and a part of factors (2)–(4) are influenced by exposure size of the substrate and are approximately proportional to the dimension of the device pattern, and most of factors (2)–(4) are influenced by exposure time. In accordance with the causes and effects, the cases are divided into respective categories of positional deviation (error) proportional to depiction size and generated according to pattern size, and the positional deviation generated in proportion to exposure time. In particular, the deviation caused by factors (2)–(4) becomes an issue. If this deviation is large, it leads to an incorrect relationship between the alignment pattern and the device pattern. Generally, the positional deviation generated according to the pattern size is considered to be relatively small.

SUMMARY OF THE INVENTION

To solve the above problems, it is an object of the present invention to provide a method for exposing a pattern plate having an alignment pattern, whereby exposure can be performed with a highly accurate positional relationship between the alignment pattern and a device pattern.

The method for exposing a pattern plate having an alignment pattern of the present invention includes exposing a pattern plate having a device pattern and an alignment pattern such as a reticle pattern, a shadow mask pattern, etc., whereby the alignment pattern is exposed at least once before the device pattern is exposed, and the alignment pattern is overlap-exposed again after the device pattern has been exposed.

In this case, it is possible to expose in such manner that the alignment pattern to be exposed before exposing the device pattern is deviated by a certain distance from the alignment pattern to be exposed after exposing the device pattern. In an alternative embodiment, the alignment pattern is overlap-exposed during the exposure of the device pattern.

Exposure can be performed by an electron beam exposure system or an optical exposure system. The pattern plates to be exposed include a reticle pattern original plate, a shadow mask pattern original plate, etc.

The present invention provides pattern plates having an alignment pattern exposed by the above exposure method.

Further, the present invention also provides a method for correcting positional deviation of the device pattern such as a reticle pattern, a shadow mask pattern, etc. and an alignment pattern, whereby the device pattern and the alignment pattern are exposed, and a positional deviation between the resulting device pattern and the alignment pattern measured, whereupon the alignment pattern is corrected according to the measured value, and the positional deviation of the center of the device pattern relative the alignment from a desired design value is corrected.

According to the present invention, the alignment pattern is exposed at least once before exposing the device pattern, and the alignment pattern is subsequently overlap-exposed again after the device pattern has been exposed. Thus, compared with the preparation of the alignment pattern by exposing only once before or after exposing the device pattern as practiced in the past, the positional deviation between the alignment pattern relative the device pattern, which may change depending upon the exposure time of the device pattern, can be almost perfectly corrected, and the degradation in positional accuracy during the exposure, which changes according to pattern size, can be reduced.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

The following description discloses in connection with the drawings a method of the present invention for exposing a pattern plate having an alignment pattern, along with an example application of the method as applied to the reticle mask.

Figure 1:
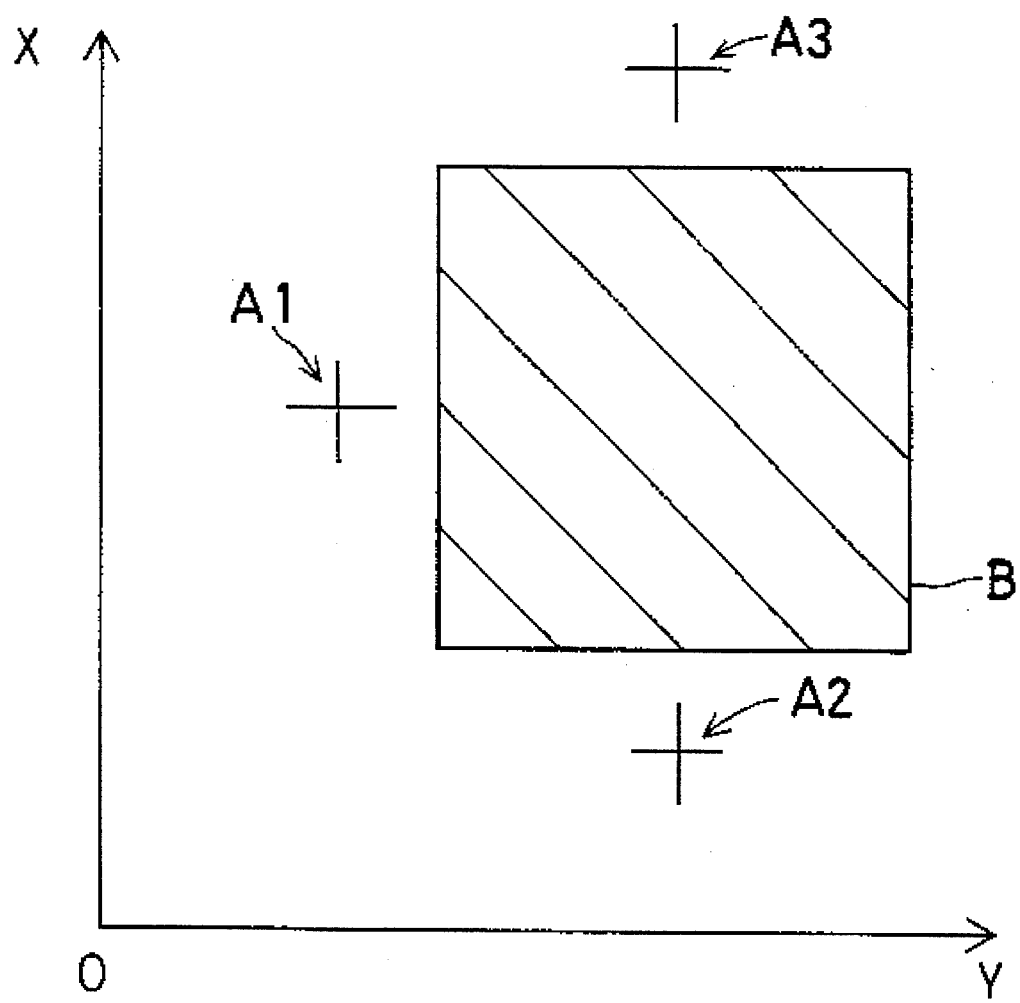
FIG. 1 is a plan view for explaining the order to expose a reticle mask according to an embodiment of the present invention.

As shown in the plan view of FIG. 1, when a pattern plate is produced, with a device pattern B, and alignment patterns A1, A2 and A3 around B, passing through the centers of the X and Y dimensions of the device pattern B, a position control system such as laser interferometer, and X and Y stage driving system are used. Exposure is performed by the following procedure using an electron beam exposure system or an optical exposure system. First, the alignment patterns A1, A2 and A3 are exposed, and the device pattern B is then exposed. Next, the alignment patterns A1, A2 and A3 are again exposed, overlapping the respective alignment patterns of the first exposure.

Through exposure of the alignment patterns A1, A2 and A3 before and after exposing the device pattern B, the accuracy of the positional relationship between the alignment patterns A1, A2 and A3 on one side and the device pattern B on the other side can be improved. In particular, it is possible to almost perfectly correct relative positional deviation (i.e., the error from a predetermined position) between the alignment patterns and the device pattern caused by changes of the above factors (2)–(4) during the exposure of the device pattern, and to alleviate the degradation of the positional accuracy in the exposure as caused by the above factors (1), (4), etc.

Figure 2:
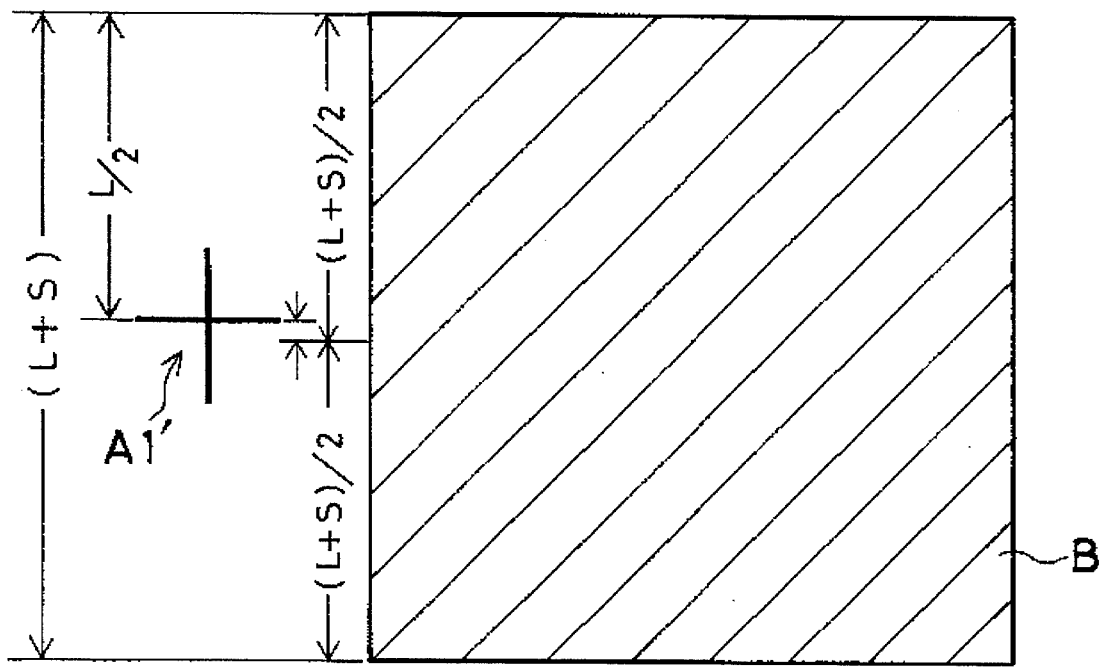
FIG. 2 is a plan view of an entire reticle mask for explaining a principle to correct relative positional deviation between an alignment pattern and a device pattern according to the present invention.
Figure 3:
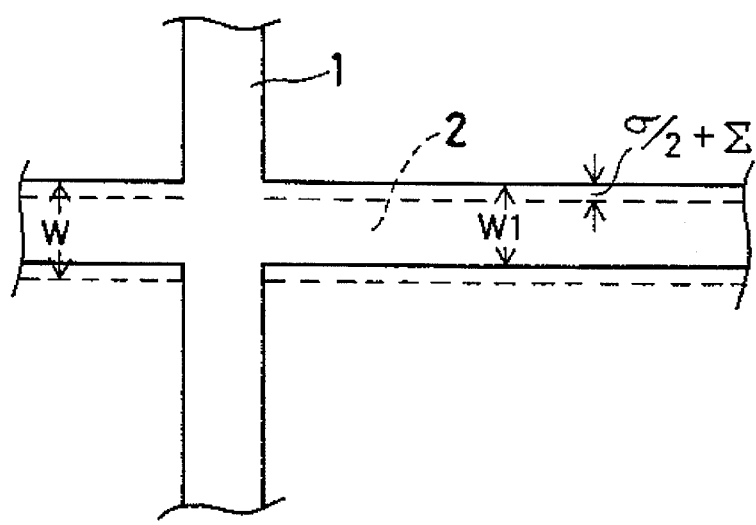
FIG. 3 is a partial view of a part of an alignment pattern similar to FIG. 2.

Referring to FIG. 2 and FIG. 3, description will be given of a method for correcting relative positional deviation between the alignment patterns and the device pattern through exposure of the alignment patterns A1, A2 and A3 before and after exposing the device pattern B. For easier explanation, the description will be provided with reference to positional deviation along the X direction only, with the same concepts being equally applicable along the Y direction.

As shown in FIG. 2, assume that the desired design dimension of the device pattern B is L and that the actual exposed dimension is L+s. If it is considered that the deviation s is a sum of the deviation σ approximately proportional to pattern dimension and the deviation Σ approximately proportional to exposure time, the positional deviation Δ1 between alignment pattern A1' exposed at first and the center of a device pattern B exposed secondly is given by:

$$\Delta 1 \div (L+s)/2 - L/2 = s/2 = (\sigma + \Sigma)/2$$

As shown in FIG. 3, if it is supposed that line width of the first exposure of the alignment pattern is W1, the deviation between the line 1 exposed at first and the line 2 exposed secondly is: σ/2+Σ. Therefore, the line width W of the entire alignment pattern as exposed twice is: W1+σ/2+Σ. Accordingly, the positional deviation Δ2 between the center of the line 1 exposed at first and the center of the line of the entire alignment pattern A1 is given by:

$$\Delta 2 \div (W1 + \sigma/2 + \Sigma)/2 - W1/2 = \sigma/4 + \Sigma/2$$

Thus, the positional deviation Δ between the center of the alignment pattern A1 prepared in overlap exposures and the center of the device pattern B is given by:

$$\Delta \div \Delta 1 - \Delta 2 = (\sigma + \Sigma)/2 - (\sigma/4 + \Sigma/2) = \sigma/4$$

Specifically, if the method of preparing a pattern plate according to the present invention is compared with the conventional method, by which the alignment pattern is not exposed by overlap-exposure and it is exposed only once either before and after exposing the device pattern B, the distance between the center of the alignment pattern A1 and the center of the device pattern B is found to deviate from the desired distance by only $\Delta \div \sigma/4$ in case of the present invention, and the positional deviation Σ which depends upon the exposure time is not involved. In the conventional case, the actual distance is found to deviate from the desired distance by a deviation of $\Delta 1 \div (\sigma+\Sigma)/2$. The deviation which is proportional to pattern dimension is approximately two times greater than that of the present invention. Further, the positional deviation, which is dependent upon the exposure time, corresponds to one-half of the entire exposure time. That is, it is possible according to the present invention to almost perfectly correct relative positional deviation σ/2 between the alignment patterns and the device pattern as caused by the changes of factors (2)–(4) during exposure of the device pattern, and also to reduce the degradation of positional accuracy σ/2 of the exposure as caused by factors (1), (4), etc. to about one-half.

Figure 4:
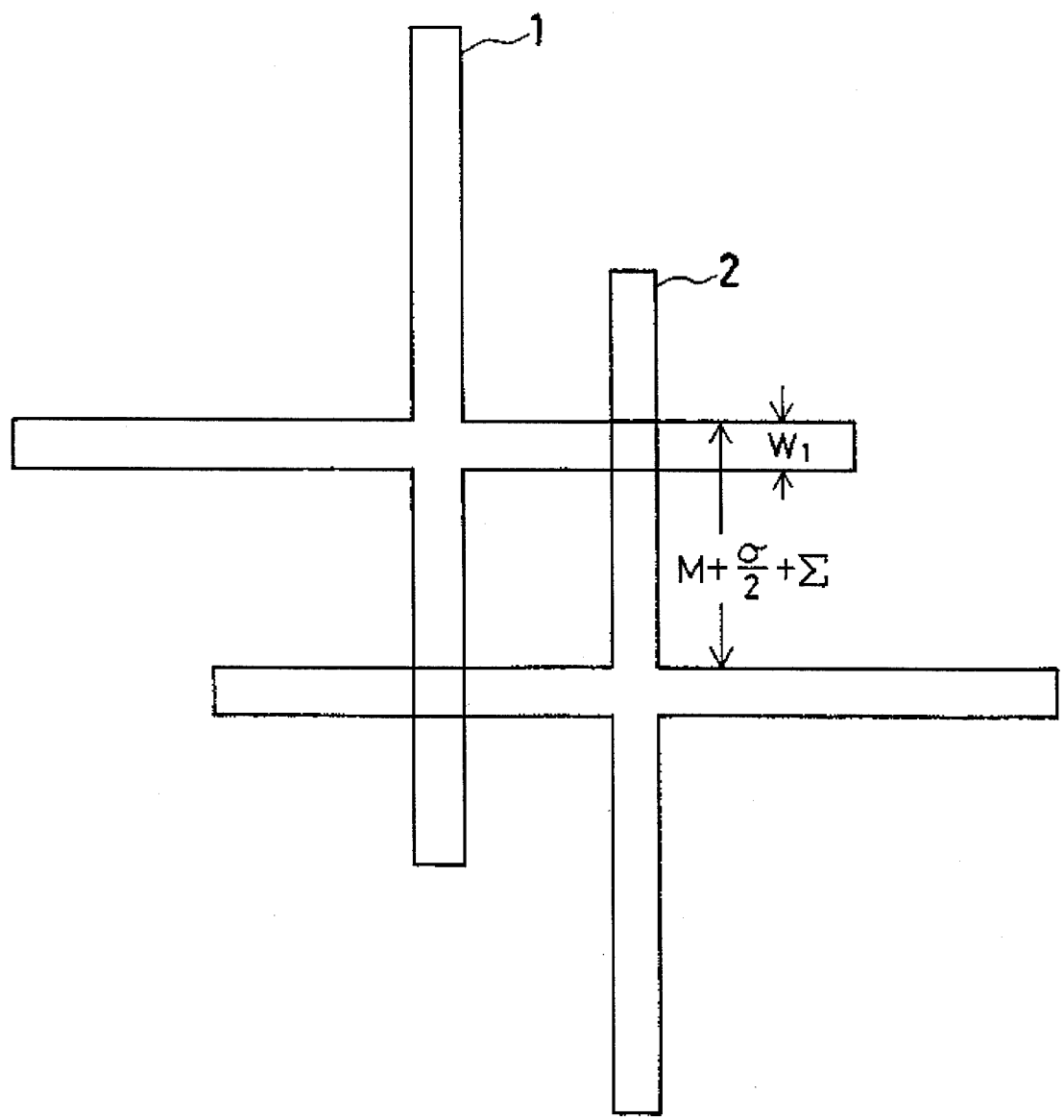
FIG. 4 is a partial view of an alignment pattern of another example similar to FIG. 2.

When a first exposure position and a second exposure position of the alignment pattern deviate by a certain distance M in design as shown in FIG. 4, it is possible to almost perfectly correct the relative positional deviation Σ/2 between the alignment pattern and the device pattern caused by the changes in factors (2)–(4) during exposure of the device pattern and to reduce the degradation of the positional accuracy σ/2 of exposure caused by factors (1), (4), etc. in approximately one-half.

As described above, according to the method for exposing a pattern plate of the present invention, alignment patterns are prepared by overlap-exposure before and after the device pattern exposure. Using an intermediate position of the overlapped alignment pattern (overlap exposed alignment pattern) as the central position of the alignment pattern, the deviation of the alignment pattern is controlled in accordance with the deviation of the device pattern, and the deviation from the predetermined value of the positional relationship with respect to the center of the device pattern is corrected. As is evident from this principle, the method for exposing alignment mark according to the present invention is suitable for pattern plates used for reticle masks of a highly integrated semiconductor device, and also the pattern plates of large size, high density shadow masks, providing a large size device pattern and complicated patterns requiring much time to expose.

In rare cases where the direction of the changes of the above factors (1)–(4) is not constant, it is advised not to restrict exposure of the alignment pattern to before and after exposing the device pattern, and the alignment pattern exposure may be performed a few times during the exposure of the device pattern.

The above description disclosed a method for matching exposure deviation of a device pattern wherein alignment patterns are corrected by overlap-exposure of the alignment patterns before and after the device pattern exposure. As an alternative, the following method may be employed: a device pattern B and alignment patterns A1, A2 and A3 are exposed as shown in FIG. 1. Without touching the device pattern B which includes a given exposure deviation, an actual positional deviation is determined between the device pattern B relative to the alignment patterns A1, A2 and A3. By correcting the alignment patterns A1, A2 and A3, the relative placement of the center of the device pattern with respect to the alignment patterns can be made to match a desired design value, thus correcting the deviation from the desired relative relationship.

Figure 5:
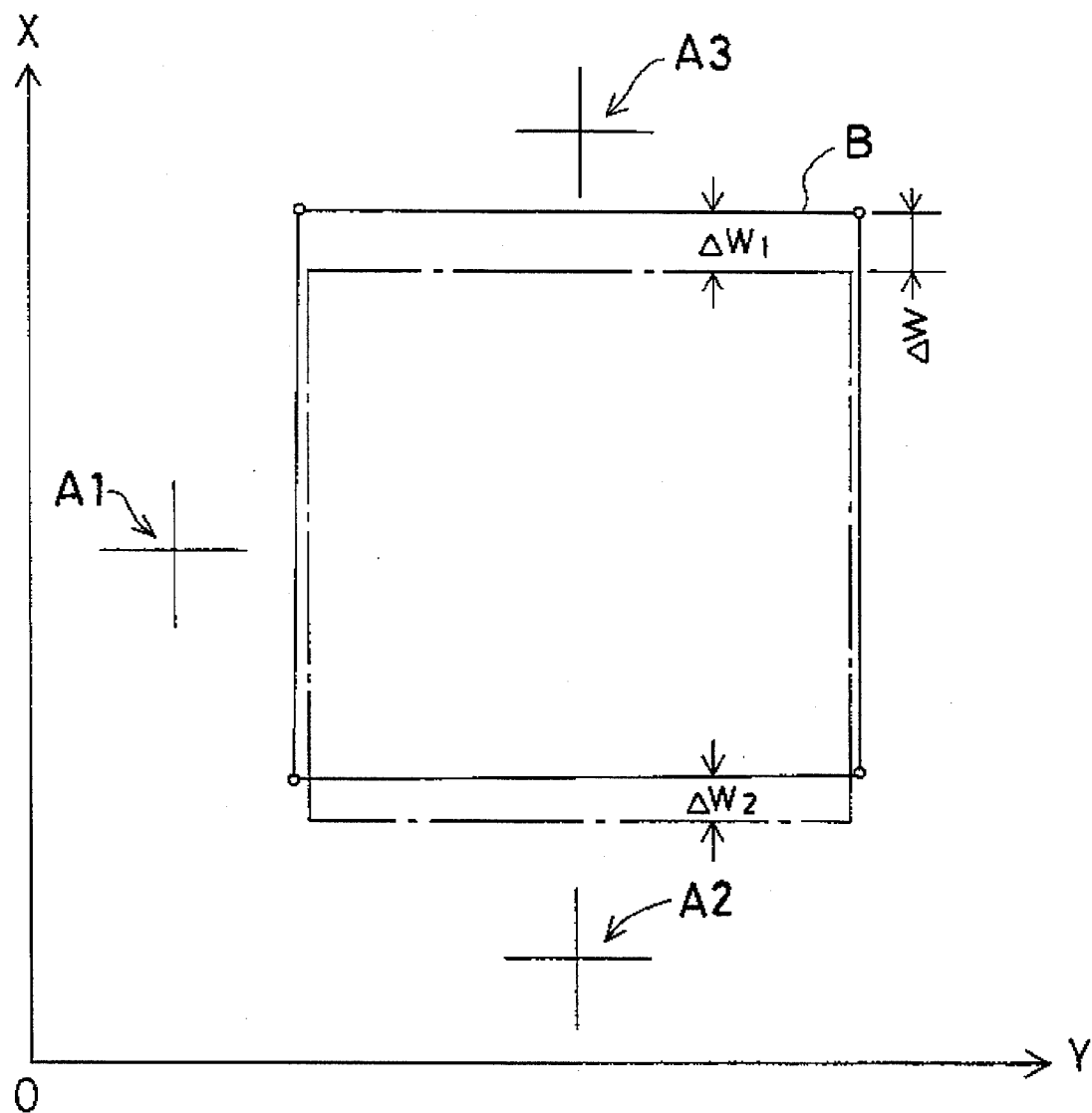
FIG. 5 is a plan view showing the positional relationship between a device pattern and an alignment pattern developed after an actual exposure.

A detailed description will be given below regarding this example. FIG. 5 shows the device pattern B and the alignment patterns A1, A2 and A3 after exposure and development. The dotted chain line in FIG. 5 represents the coordinates where the device pattern should be positioned with reference to the alignment patterns A1, A2 and A3. The alignment patterns A1, A2 and A3 may be exposed after exposing the device pattern B, or, alternatively, the procedure may be reversed or may be performed in another order; there is no restriction. After exposure and development, actual positional deviation of the device pattern B along the X direction is measured by a coordinate position measuring system. If, for example, it is deviated by $\Delta W_1$ upward from a standard position on an upper side, and by $\Delta W_2$ upward from the standard position on the lower side, the alignment pattern A1 in X direction is deviated relatively downward by $(\Delta W_1 + \Delta W_2)/2 = \Delta W$ than the actual device pattern B. Accordingly, it is necessary to move the alignment pattern A1 by ΔW upward.

Figure 6A:
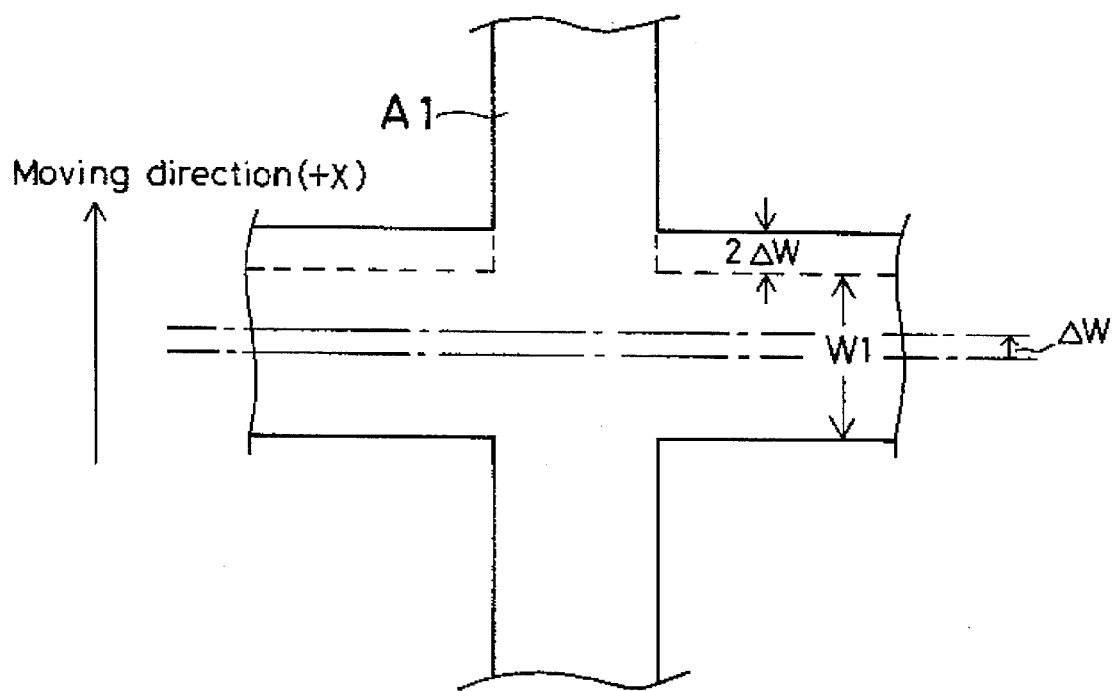
FIG. 6 is a partial plan view of an alignment pattern for explaining a method for moving alignment pattern.
Figure 6B:
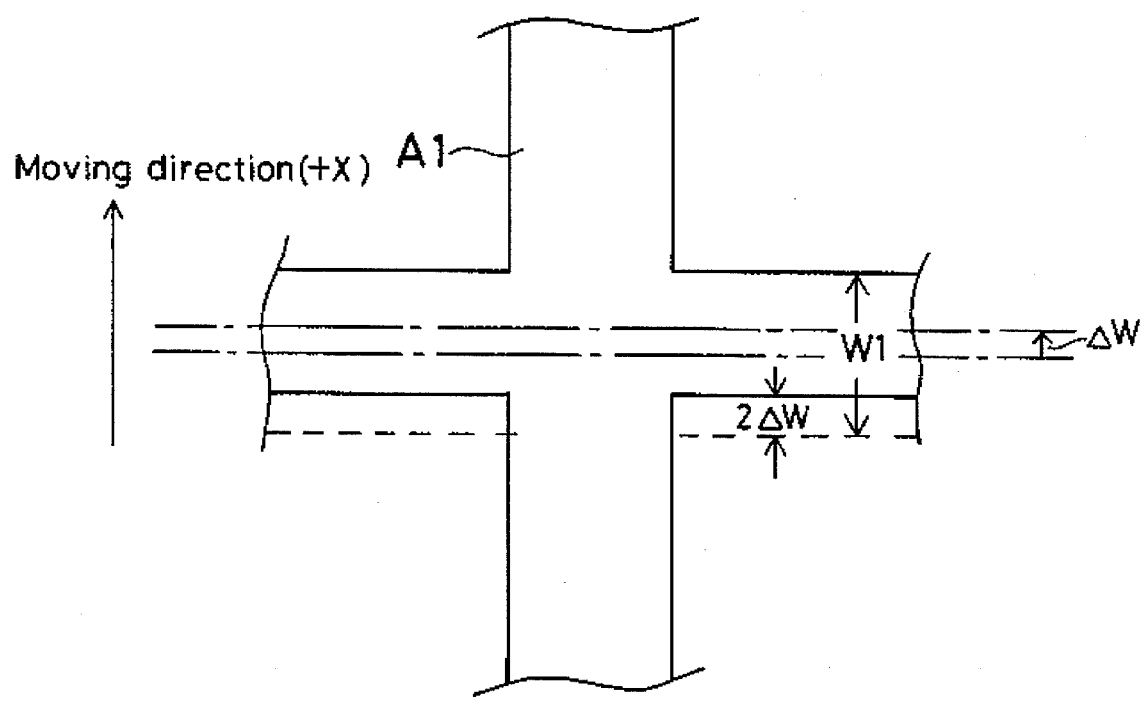

To move the alignment pattern A1 in a desired direction, the portion of the alignment pattern A1 perpendicular to the direction of movement should be thickened by two times the amount of movement desired ΔW toward the direction of movement, or the portion opposite to the direction of movement should be thinned by two times the amount of movement desired $\Delta W$. To thicken the line perpendicular to the direction of movement, the portion of the alignment pattern A1 facing the +X direction is augmented by $2\Delta W$ as shown in FIG. 6($a$). As a result, the center of the alignment pattern A1 is moved by an amount $\Delta W$ toward +X with respect to its position before correction, and the purpose is attained. To thin the line perpendicular to the direction of movement, the portion facing to −X of the alignment pattern A1 is reduced by an amount $2\Delta W$ as shown in FIG. 6($b$). Accordingly, the center of the alignment pattern A1 is moved toward +X by an amount $\Delta W$ with respect to its position before correction.

The same corrections are provided for the alignment patterns A2 and A3.

Figure 7:
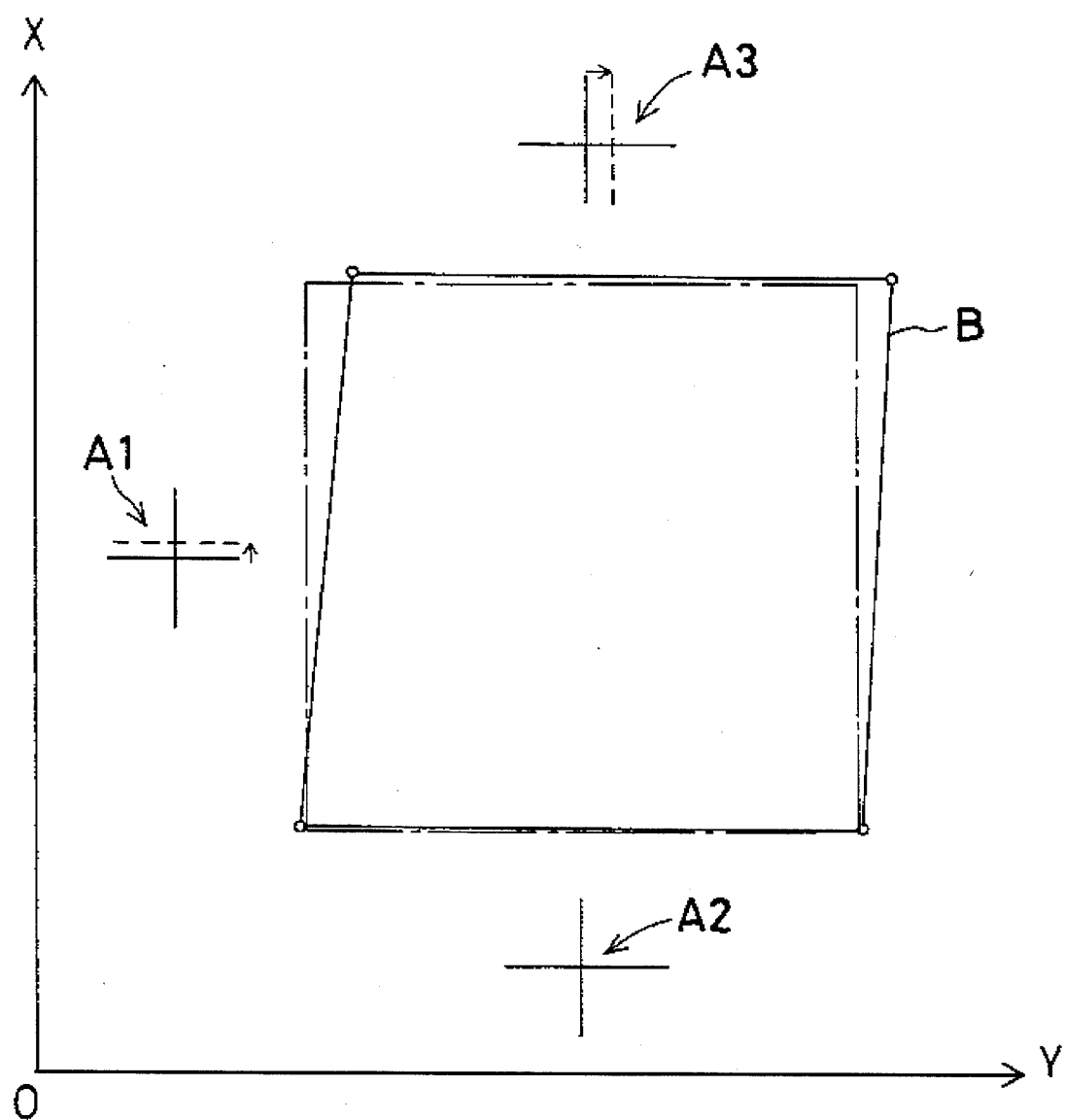
FIG. 7 is a plan view for explaining a correction method when the device pattern is deviated by an angle in relation to the alignment pattern.

Further, in case the device pattern B is rotated or deviated by an angle in relation to the alignment patterns A1, A2 and A3, the alignment pattern A2 or A3 is used as reference, and the position of the other non-reference alignment patterns A3, A2 or A1 are moved as described above. With reference to FIG. 7, assuming the device pattern B is deviated in a clockwise direction with respect to the pattern A2 the upper pattern A3 is deviated relatively leftward in relation to the device pattern B. After measuring the deviation amount, the alignment pattern A3 is moved rightward by a distance corresponding to the amount of deviation by the procedure described for FIG. 6. Then, the X-axis is slightly rotated so as to be parallel to an axis connecting the alignment pattern A2 with the newly set alignment pattern A3. With this rotation, the alignment pattern A1, serving as a position reference along the X direction, is also moved upward by a distance determined by the angle of rotation. Because a reticle mask is in fact a complex body, having both parallel and rotational deviation components, the accuracy of alignment patterns can be improved by combining the correcting methods for positional and angular deviation.

In the above method, various procedures are employed to remove a part of a light shielding film of the alignment pattern (FIG. 6($b$)) or to augment it (FIG. 6($a$)). For example, additional light shielding material may be partially added to a pattern portion as shown in FIG. 6($a$), using a focusing ion beam pattern white defect corrector or a laser pattern white defect repair unit, or a pattern portion may be partially deleted as shown in FIG. 6($b$) using a focusing ion beam pattern black defect corrector or a laser pattern black defect repair unit. An additional technique includes providing a resist pattern over the region to be repaired using a spot exposure system, a direct exposure system, etc., wherein additional material is deposited through an opening of the resist pattern for augmenting a desired pattern of an alignment portion, or alternatively a part of the alignment pattern is eliminated by etching in accordance with the resist pattern. In addition, other various film forming methods or film removing methods may be used.

In the above, if distortion of the device pattern B is small, deviation $\Delta W_1$ or $\Delta W_2$ may be on one of the sides when relative positional deviation is $\Delta W$.

Thus, the device pattern B and the alignment patterns A1, A2 and A3 are exposed, and without touching the exposed device pattern B, which includes exposure deviation, the actual positional relationship between the device pattern B and the alignment patterns A1, A2 and A3 is measured and a deviation determined in accordance with the amount by which the actual positional relationship deviates from a desired positional relationship. By correcting the alignment patterns A1, A2 and A3, the deviation by which the actual positional relationship, of the center of the device pattern relative the alignment patterns, deviates from the designed value is corrected. Thus, it is possible to almost perfectly correct the deviation of the positional relationship between the alignment patterns and the device pattern caused during exposure of the device pattern. Further, this correction method is advantageous in that the reticle mask which might have otherwise been unusable due to the poor positional accuracy of the alignment pattern relative the device pattern is thereby made usable.

In the above explanations for FIG. 1 to FIG. 7, the description was provided with reference to a reticle mask for a semiconductor exposure having alignment patterns around it. However, the exposing method and correcting method of the present invention can also be used for providing a shadow mask pattern plate having an alignment pattern for positioning, or for providing an electrode pattern plate for a liquid crystal panel.

As described above, according to the method of exposing a pattern plate having an alignment pattern of the present invention, first alignment patterns are exposed at least once before exposing the device pattern, and alignment patterns are subsequently overlap-exposed over the first alignment patterns after the device pattern has been exposed. Thus, compared with the conventional case where the alignment pattern is prepared by a single exposure before or after exposing the device pattern, it is possible to almost perfectly correct relative positional deviations between the alignment pattern and the device pattern, as caused by various changes during the period of time of the exposure of the device pattern, and to reduce degradation of positional accuracy as influenced by pattern size.

Therefore, it is possible:

(1) to carry out the production of pattern plates with high positional accuracy between the alignment pattern and the device pattern, and to achieve better production;

(2) to provide an exposure method for controlling positional accuracy between the alignment pattern and the device pattern and to cope with changes which may occur during exposure such as a temperature change, an electrical change, a mechanical change of the substrate and a change of the position control system; and (3) to provide an exposure method for controlling positional accuracy between the alignment pattern and the device pattern caused by exposure time and the size even in case of a large size pattern such as that for a shadow mask original plate.

For the pattern plate already exposed once, the accuracy can be increased by correcting the alignment pattern.

What we claim is:

1. A method for exposing a pattern plate for providing a device pattern and an alignment pattern, wherein the alignment pattern is exposed before exposing the device pattern, and the alignment pattern is overlap-exposed again after the device pattern has been exposed.

2. A method for exposing a pattern plate according to claim 1, wherein the alignment pattern to be exposed before exposing the device pattern is shifted by a certain distance from the alignment pattern to be exposed after exposing the device pattern.

3. A method for exposing a pattern plate according to claim 1, wherein the alignment pattern is overlap-exposed even during exposure of the device pattern.

4. A method for exposing a pattern plate according to any one of claims 1 to 3, wherein an electron beam exposure system is used to expose.

5. A method for exposing a pattern plate according to any one of claims 1 to 3, wherein an optical exposure system is used to expose.

6. A method for exposing a pattern plate according to any one of claims 1 to 3, wherein the pattern plate to be exposed is a reticle pattern original plate.

7. A method for exposing a pattern plate according to any one of claims 1 to 3, wherein the pattern plate to be exposed is a shadow mask pattern original plate.

8. A pattern plate having an alignment pattern exposed by a method for exposing according to any one of claims 1 to 3.

* * * * *